United States Patent
Hu et al.

(10) Patent No.: US 10,903,306 B2
(45) Date of Patent: Jan. 26, 2021

(54) INTEGRATED TRENCH CAPACITOR

(71) Applicant: TEXAS INSTRUMENTS INCORPORATED, Dallas, TX (US)

(72) Inventors: Binghua Hu, Plano, TX (US); Hideaki Kawahara, Plano, TX (US); Sameer P. Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/163,606

(22) Filed: Oct. 18, 2018

(65) Prior Publication Data
US 2019/0051721 A1    Feb. 14, 2019

Related U.S. Application Data

(62) Division of application No. 15/264,147, filed on Sep. 13, 2016, now Pat. No. 10,134,830.

(51) Int. Cl.
| | |
|---|---|
| *H01L 49/02* | (2006.01) |
| *H01L 21/02* | (2006.01) |
| *H01L 21/265* | (2006.01) |
| *H01L 21/306* | (2006.01) |
| *H01L 21/3205* | (2006.01) |
| *H01L 21/762* | (2006.01) |
| *H01L 27/06* | (2006.01) |
| *H01L 29/06* | (2006.01) |
| *H01L 29/08* | (2006.01) |

(52) U.S. Cl.
CPC ......... *H01L 28/40* (2013.01); *H01L 21/0223* (2013.01); *H01L 21/26513* (2013.01); *H01L 21/30625* (2013.01); *H01L 21/32055* (2013.01); *H01L 21/76224* (2013.01); *H01L 27/0629* (2013.01); *H01L 29/0649* (2013.01); *H01L 29/0847* (2013.01)

(58) Field of Classification Search
CPC ..................................................... H01L 28/40
See application file for complete search history.

(56) References Cited

U.S. PATENT DOCUMENTS

| | | | |
|---|---|---|---|
| 5,843,820 A | 12/1998 | Lu | |
| 6,236,079 B1 * | 5/2001 | Nitayama | H01L 27/10832 257/304 |
| 2006/0211196 A1 | 9/2006 | Tanaka et al. | |
| 2008/0211064 A1 * | 9/2008 | Orner | H01L 21/763 257/622 |
| 2012/0012971 A1 | 1/2012 | Kwon et al. | |

\* cited by examiner

*Primary Examiner* — William A Harriston
(74) *Attorney, Agent, or Firm* — Andrew R. Ralston; Charles A. Brill; Frank D. Cimino (57) ABSTRACT

Embodiments of a deep trench capacitor are disclosed. In one example a plurality of deep trenches is located in a first region of a semiconductor wafer, the first region having a first conductivity type. A corresponding dielectric layer is located on a surface of each of the plurality of deep trenches, and a corresponding doped polysilicon filler is located within each of the dielectric layers. Dielectric-filled trenches are located between each of the dielectric layers and the surface of the semiconductor wafer.

20 Claims, 9 Drawing Sheets

FIG. 6

INTEGRATED TRENCH CAPACITOR

CROSS-REFERENCE TO RELATED APPLICATIONS

Pursuant to 35 U.S.C. § 120, this divisional application claims benefits of and priority to U.S. patent application Ser. No. 15/164,147 (TI-76470), filed on Sep. 13, 2016, the entirety of which are hereby incorporated herein by reference.

FIELD OF THE DISCLOSURE

Disclosed embodiments relate generally to the field of integrated circuit (IC) design and processing. More particularly, and not by way of any limitation, the present disclosure is directed to an integrated trench capacitor.

BACKGROUND

There are a number of issues that arise when attempting to integrate capacitors into the flow for an IC. Conventionally, integrated capacitors are built on the surface of the chip, using the metal-1 or metal-2 layer for the bottom plate of the capacitor and a TiN Layer for the top plate. These capacitors have a capacitive density of approximately 1.5 $\mu F/\mu m^2$ and can attain a highest operating voltage of approximately 8V. More recently, trench capacitors have been formed in the substrate/epitaxial layers, but trench capacitors are difficult to integrate into existing process flows and generally require too many additional masks to be cost effective. Improvements in integrating capacitors into semiconductor process flows are needed.

SUMMARY

Disclosed embodiments implant a first dopant type (e.g., N+) and thermal drive to form a bottom plate as a heavily doped well. If the first dopant type is a different type from the substrate and epitaxial layers (e.g., the substrate/epitaxial layer are P− while the well is N+), the capacitor is isolated; if the first dopant type is the same as the substrate/epitaxial layer, the capacitor is not isolated. A single mask is used to form deep trenches in the well and a dielectric layer is formed (e.g., by growing a thermal oxide or depositing an oxide/nitride/oxynitride (ONO) combination). An in-situ doped (ISD) polysilicon fill of a second type (which can be either N+ or P+) is provided to form the top plate of the capacitor. To maintain the integrity of the dielectric layer during later processing, shallow trench isolation (STI) is added where the trench edge meets the surface of the epitaxial layer. In at least some processes, the flow for the capacitor is modular, i.e. a group of steps can be incorporated into a standard flow when capacitors are needed and can also be quickly removed when no capacitors are required. The added steps require the addition of only a single mask.

In one aspect, an embodiment of a method for providing a deep trench capacitor in a semiconductor process is disclosed. The method includes forming a plurality of deep trenches in a first region of a semiconductor wafer, the first region having well doping of a first type; forming a dielectric layer on a surface of the plurality of deep trenches; depositing a doped polysilicon layer to fill the plurality of deep trenches, the doped polysilicon being doped with a dopant of a second type; and forming shallow trench isolation overlying the dielectric layer at an intersection of the dielectric layer with the surface of the semiconductor wafer.

In another aspect, an embodiment of an integrated capacitor formed in an integrated circuit (IC) chip is disclosed. The integrated capacitor includes a well structure formed in an epitaxial layer and doped with a first type of dopant, the well structure forming a first plate of the capacitor; a plurality of deep trenches formed in the well structure and filled with polysilicon that is doped with a second type of dopant, the polysilicon layer being separated from the well structure by a dielectric layer; and shallow trench isolation that overlies the dielectric layer at the surface of the IC chip.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 5:
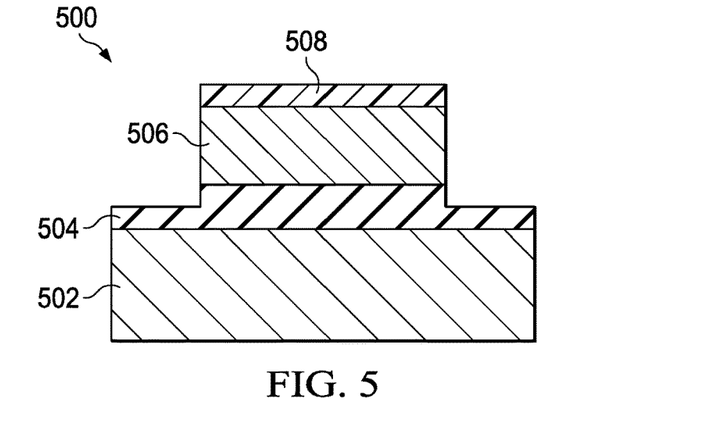
FIG. 5 depicts a schematic view of a conventional integrated capacitor.

Turning first to FIG. 5, a conventional integrated capacitor 500 is shown. This type of integrated capacitor is formed on top of the wafer after processing of the silicon is completed. Metal bottom plate 502 is formed as part of the metal-1 or metal-2 layers. A dielectric layer or layers is then formed on top of metal bottom plate 502, such as oxide/oxynitride/oxide dielectric 504, which may have a thickness of less than 350 Å. In the example shown, top plate 506 of the capacitor is formed of layers of TiN/Ti/TiN. Hardmask 508 is used to form a pattern that removes unwanted portions of top plate 506 and dielectric 504 and may be removed before further processing. Such conventional integrated capacitors are relatively easy to add to a process flow, as a single mask is required to pattern the capacitor. However, the capacitive density offered by such capacitors is limited at about 1.5 $\mu F/\mu m^2$ and the highest operating voltage is about 8V.

Figure 6:
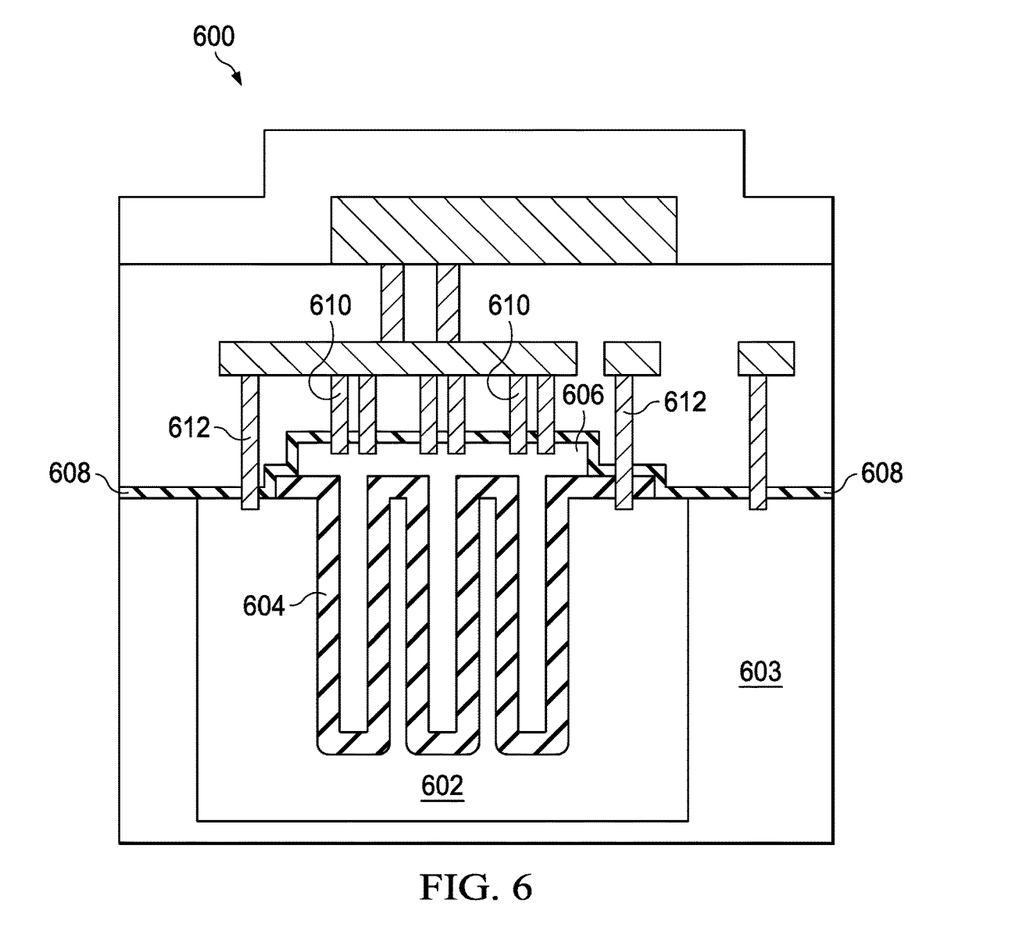
FIG. 6 depicts a schematic of a conventional standalone trench capacitor.

FIG. 6 depicts conventional Standalone Trench Capacitor 600, i.e., a capacitor that is the sole device on a chip. A bottom plate is formed by heavily doping well 602 in silicon layer 603, followed by depositing and patterning a photoresist layer (not specifically shown), then etching the deep trenches in well 602. Then dielectric layer 604 is formed. Dielectric layer 604 can comprise, for example, an oxide or an ONO layer which is then patterned and etched to remove portions of dielectric layer 604 that are not part of the capacitor. Heavily doped polysilicon layer 606 is deposited into the trenches and patterned to form the upper plate. In both cases, the doped regions may be formed by ion implantation or other methods as are well known to those having ordinary skill in the art. The surface can then be covered by passivation layer 608 and the metallization layers formed and patterned. As depicted in this figure, six vias 610 provide connection to the upper plate, while two vias 612 are shown connecting to the bottom plate. While this layout serves well for standalone capacitors, it is difficult to integrate this process into any technology that uses STI, as the vertical topography of polysilicon layer 606 prevents the use of chemical-mechanical polishing (CMP) in subsequent steps. Three masks are also required to form capacitor 600, i.e., 1) to pattern the deep trenches, 2) to etch the dielectric, and 3) to etch the top plate, so that even if this capacitor can be integrated with other processes, it would be expensive to do so.

Figure 1:
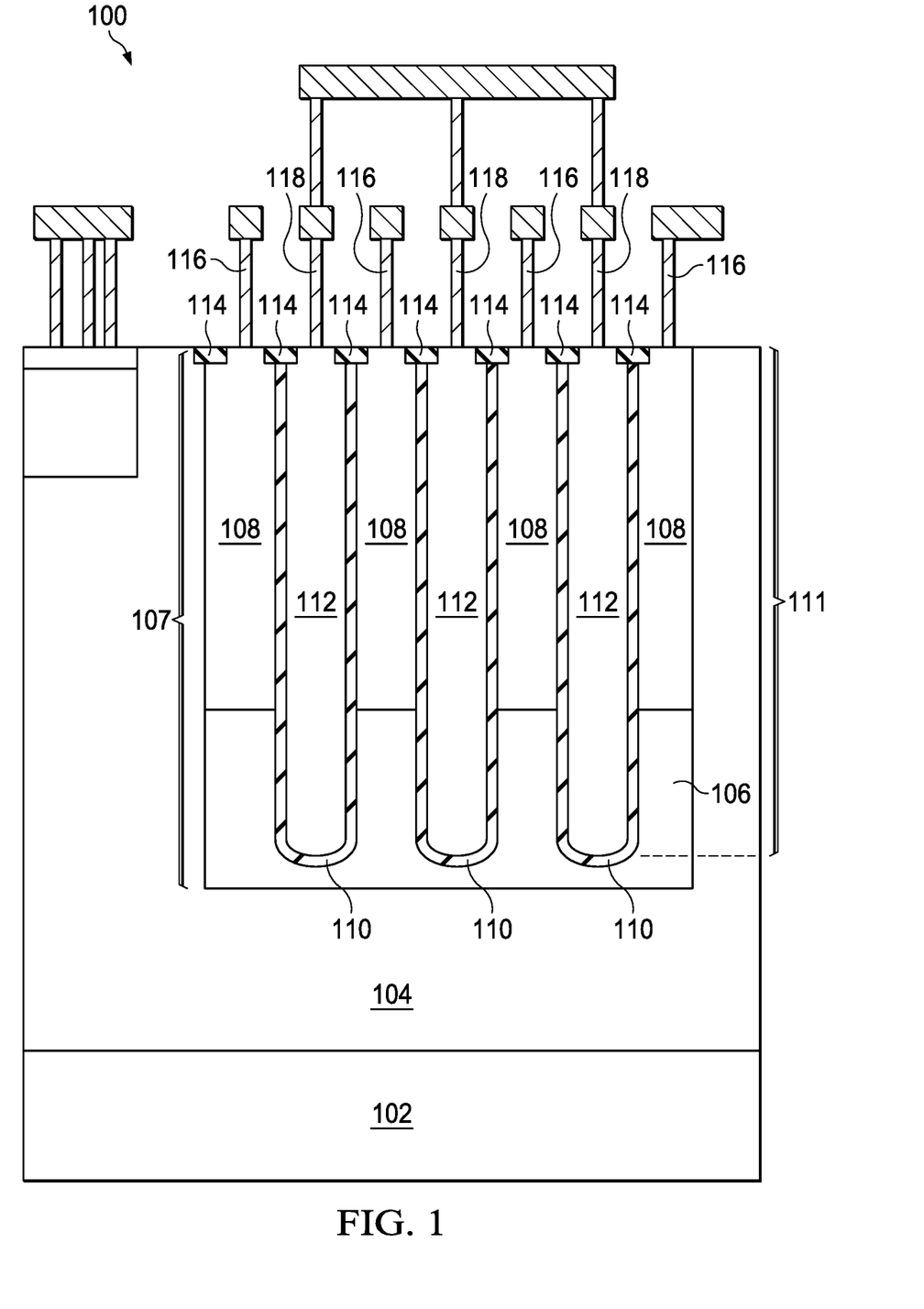
FIG. 1 illustrates a schematic view of an example integrated capacitor according to an embodiment of the disclosure.

FIG. 1 discloses capacitor 100, which can be integrated into existing process flows that utilize STI, according to an embodiment of the disclosure. Capacitor 100 is created in epitaxial layer (EPI) 104, which is grown on substrate 102, which in at least one embodiment is doped with a P-type dopant (e.g., boron). Bottom plate 107 of capacitor 100 includes buried layer 106, well implant 108 and a source/drain implant (not specifically shown in this figure), which in at least one embodiment receive N+ doping (e.g., phosphorus). In at least one embodiment, an implant of N+ doping and thermal drive is used to form heavily-doped well implant 108. By doping the well with an opposite type doping from the substrate, capacitor 100 is isolated from the substrate by the junction. Given this isolation, capacitor 100 may have a high voltage on either electrode. In at least one embodiment, Substrate 102 and Well Implant 108 have the same type of doping, such that capacitor 100 is not isolated from substrate 102. In this embodiment, the bottom plate of capacitor 100 will be grounded and only the top plate is able to carry a high voltage.

Deep trenches 111 are formed in Bottom Plate 107 and lined with dielectric layer 110. Polysilicon layer 112 is deposited, using in situ doping, to fill and overfill deep trenches 111 and planarized, e.g., by CMP. The point at which dielectric layer 110 intersects the upper surface of epitaxial layer 104/bottom plate 107 is fragile and subject to damage during later processing. In order to protect these fragile areas, STIs 114 are formed at the surface of the IC overlying the sidewalls of the previously-filled deep trenches. When transistors on the chip receive source/drain (S/D) implants, both bottom plate 107 and top plate 112 will also receive appropriate types of S/D implants. Vias 116 contact bottom plate 107 and vias 118 contact top plate 112 as part of the metallization layers.

In at least one embodiment, the formation of capacitor 100 is modular and can be inserted into existing processes without disrupting other portion of the flow process. In at least one embodiment, the formation of bottom plate 107 occurs during the creation of isolation regions in other portions of the IC. In at least one embodiment, STIs 114 are formed in conjunction with the formation of STIs on other regions of the IC. In at least one embodiment, the modular flow that is exclusively for the capacitor includes a single mask to pattern for the deep trench etch, formation of the deep trenches, formation of a dielectric on the surface of the deep trenches, and filling the deep trenches with doped polysilicon to form top plate 112. The process of creating capacitor 100 will be discussed in greater detail below.

Figure 2A:
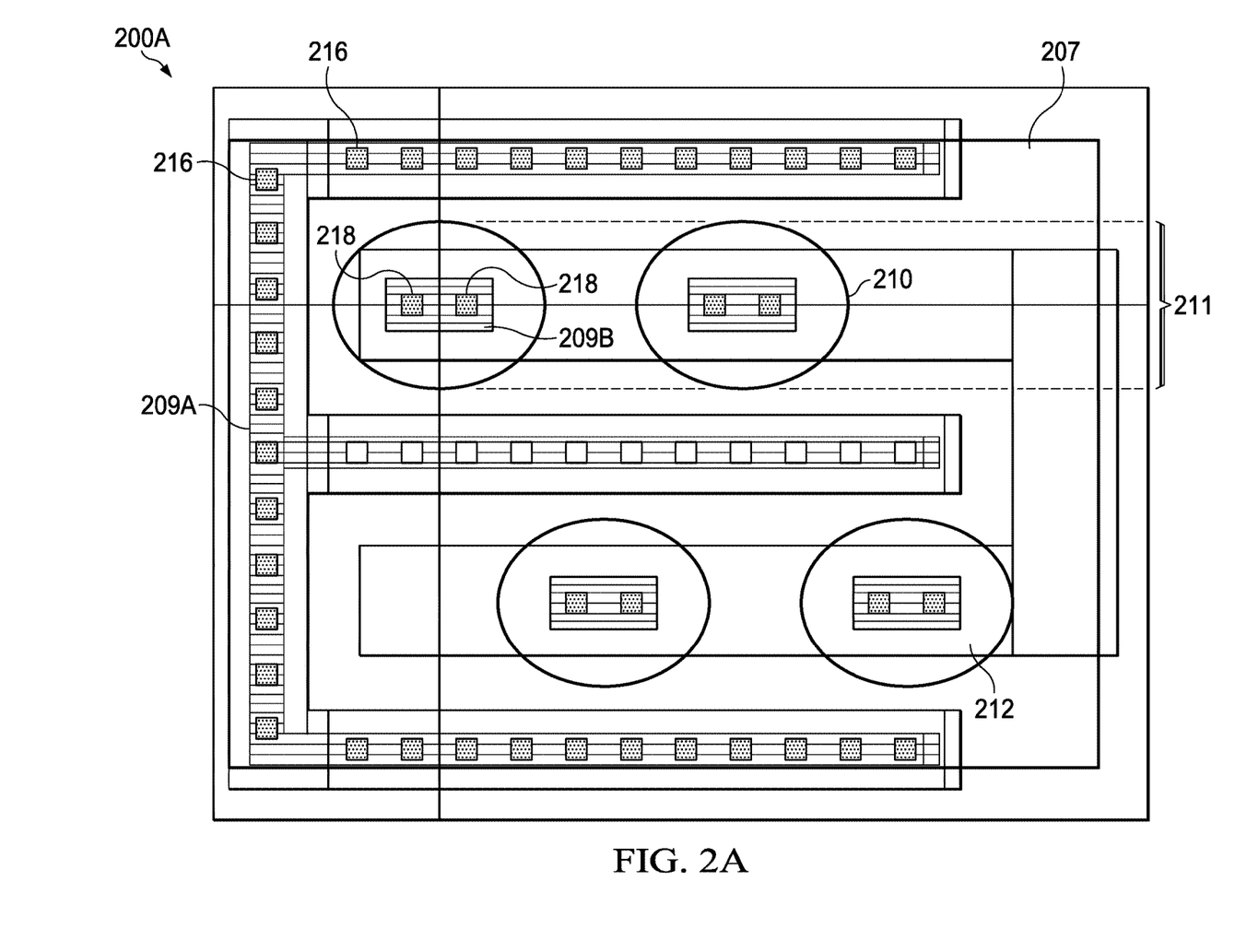
FIGS. 2A-B depict top views of two different capacitor layouts according to separate embodiments of the disclosure.
Figure 2B:
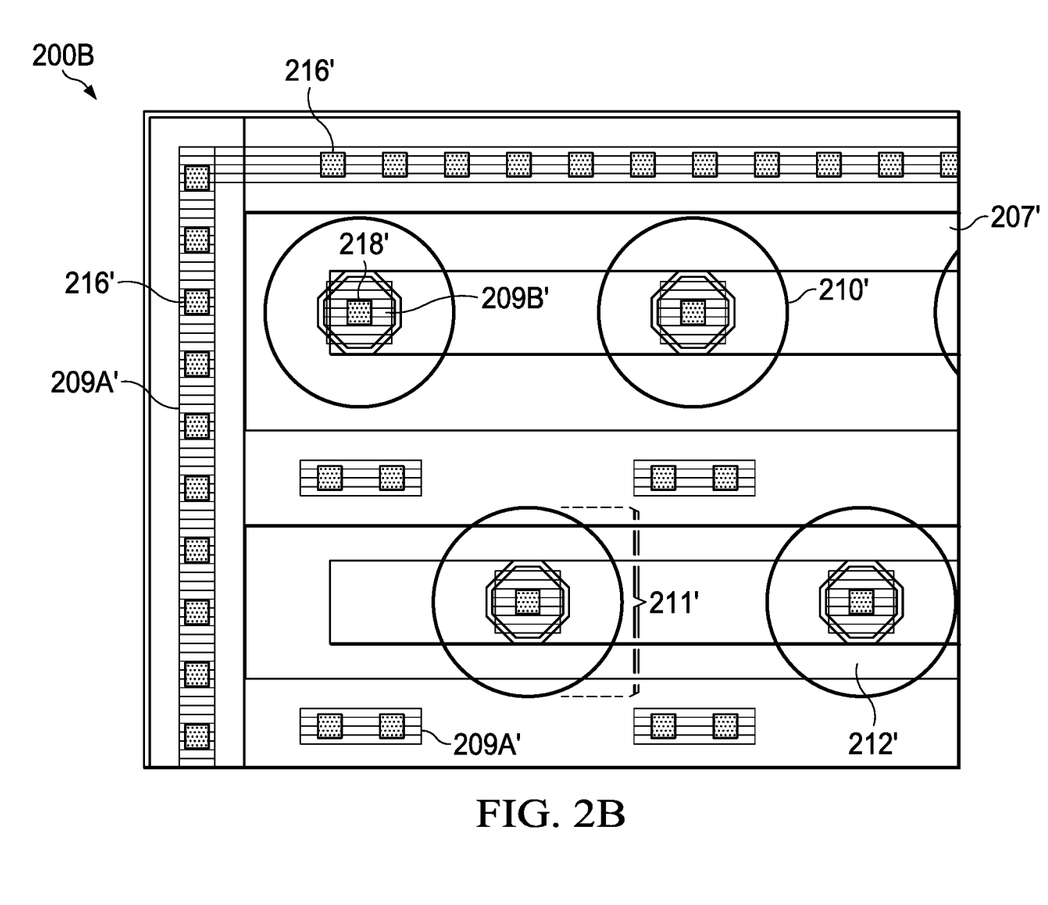

FIGS. 2A-B disclose top views of two different layouts of capacitor 200. For capacitor 200A, the area enclosed by the outer rectangle represents the well that forms bottom plate 207. Deep trenches 211, which in this embodiment have an oval cross-section, are formed in bottom plate 207 and contain a thin dielectric layer 210. The regions inside portions of dielectric layer 210 form top plate 212. Source/drain implant 209A lines three edges of capacitor 200A, as well as forming a strip between rows of deep trenches to provide a lower resistance on which to land contacts 216. Each deep trench 211 that forms a part of top plate 212 also contains a short strip of source/drain implants 209B to provide a lower resistance on which to land contacts 218.

The layout of capacitor 200B is similar to that of capacitor 200A, with bottom plate 207' surrounding deep trenches 211', which in this embodiment have a circular cross-section. Deep trenches 211' include dielectric layer 210' and the doped polysilicon that forms top plate 212'. Source/drain Implants 209A' also line the edges of capacitor 200B, although the interior regions of bottom plate 207' have short strips of source/drain Implants 209A' on which to land contacts 216' rather than a continuous strip as in capacitor 200A; each deep trench 211' also contains a section of source/drain implants 209B' on which to land contacts 218'.

In capacitor 200B, each deep trench is equidistant from each of its neighboring deep trenches, which provides decreased stress in the wafer. It is estimated that this layout will provide approximately twenty percent (20%) higher capacitive density over capacitor 200A. The disadvantage of the layout of capacitor 200B as compared to the layout of capacitor 200A is that there is only room to land a single contact 218' within each deep trench 209', so that any voids that might occur under a contact greatly reduce the ability to use the underlying deep trench. The layout of capacitor 200A has a lower capacitive density but provides enough space to land two contacts 218 for each deep trench 211 forming upper plate 212 and thus provides lower polysilicon contact resistance.

Figure 3A:
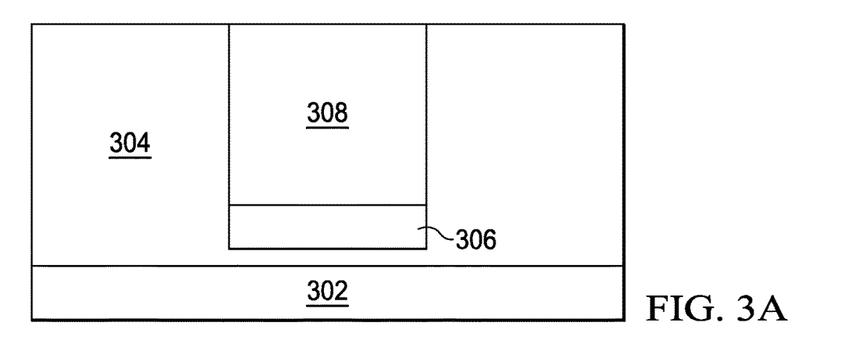
FIGS. 3A-J depict a semiconductor wafer at various stages in the process of providing an integrated capacitor according to an embodiment of the disclosure.

FIGS. 3A-J depict a schematic representation of the formation of an integrated capacitor according to an embodiment of the disclosure. FIG. 3A illustrates a portion of an IC on which a capacitor will be created. At this point, lightly doped P-type epitaxial layer 304 has been grown on P+ substrate 302, with an N-type buried layer (NBL) 306 formed during the growth of P-type EPI Layer 304. Additionally, an N-type region has been formed, i.e., patterned, implanted and driven in, to create an N-type well (DEEPN)

308, which contacts NBL 306. In one embodiment, DEEPN is doped at a range of $1\times10^{15}/cm^3$ to $2\times10^{16}/cm^3$ and NBL is doped at range $1\times10^{15}/cm^3$ to $4\times10^{15}/cm^3$. In at least one embodiment, DEEPN 308 implants and NBL 306 are used in other regions of the IC to create isolation regions, so formation of these regions is already part of a flow that does not necessarily include a capacitor. In effect, Applicants are getting a "free" mask in that regions that are to be used for one plate of the capacitor, herein referred to as the bottom plate, can be included in existing masks, so that a new mask is not necessary to create this region. In other embodiments that do not already contain these steps, an additional mask may be necessary. In at least one embodiment, this point is the beginning of the modular process that can be inserted into an existing flow.

Figure 3B:
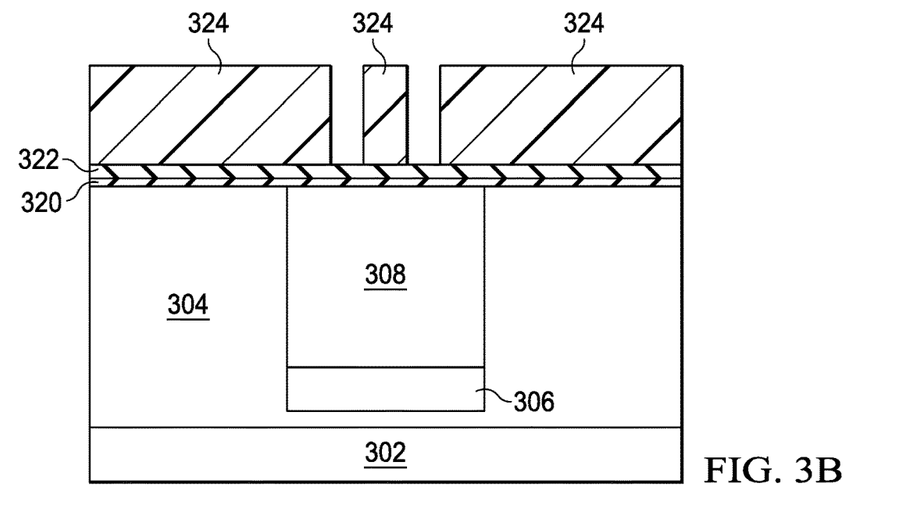
Figure 3C:
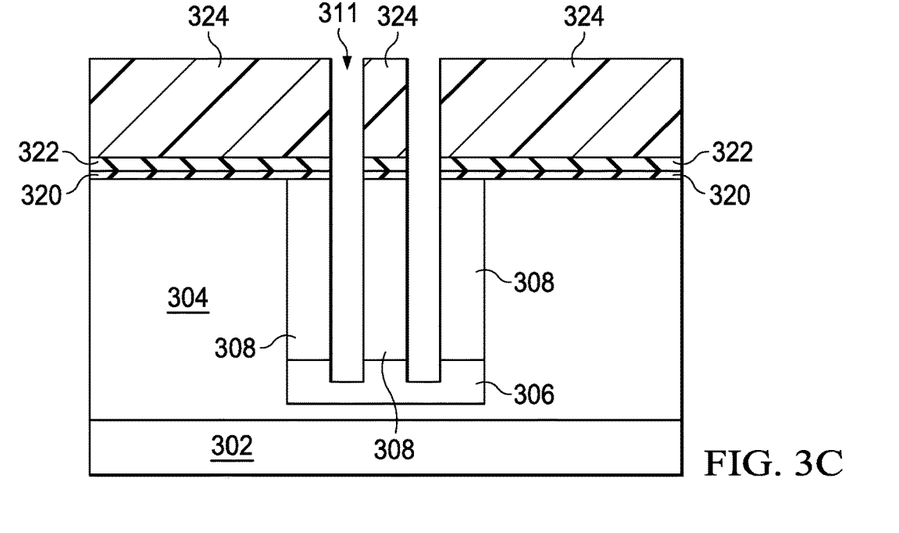

In FIG. 3B an overlying photo-resist layer 324 has been created and patterned so that the deep trenches can be formed. For purposes of illustration, two deep trenches will be described but one or more trenches could be formed. Photo-resist layer 324 overlies oxide layer 320 and nitride layer 322, which protects the surface of the chip. Photo-resist layer 324 may also include a high-density plasma (HDP) oxide hardmask (HM) layer (not specifically shown). An oxide HM is used when the photo-resist layer is thin or the trench is deep enough that the photo-resist layer would be completely destroyed in the trench etching process. FIG. 3C shows the wafer after anisotropic etching was used to form deep trenches 311 through the oxide HM (if used), silicon nitride layer 322, oxide layer 320, and into well 306/308. It will be understood that although photo-resist layer 324 is shown here as remaining intact after etching, much of the photo-resist layer may have been removed by the etch process. In at least one embodiment, using the circular trench layout of FIG. 2B, the width if the trenches is approximately 0.9 μm-1.2 μm and the trenches are spaced apart approximately 0.5 μm-1.0 μm. For an isolated capacitor, the depth of the trenches is determined by the depth of the isolation tank. The trench depth can, of course, be deeper or shallower as required by the application and to fit within the parameters of the process into which the capacitor is being integrated, e.g., the thickness of the epitaxial layer and the drive conditions for the well. In one embodiment for an isolated capacitor, the trench depth can be in the range of 5 μm to 9 μm. For a non-isolated capacitor the depth can be 20 μm deeper. In other embodiments, the depth of the trench can remain the same, while the thickness of Dielectric Layer 310 is varied to change the voltage.

Figure 3D:
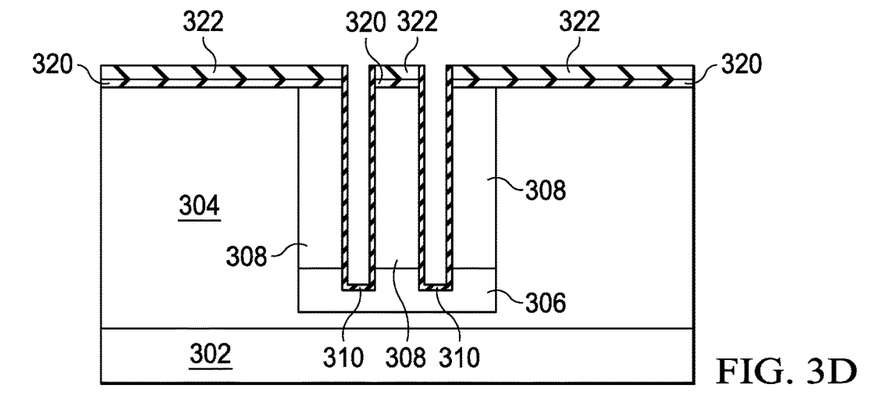

Photo-resist layer 324 is then removed and the wafer cleaned. As seen in FIG. 3D, dielectric layer 310 is grown or deposited on the sidewalls of deep trenches 311. In one embodiment, dielectric layer 310 is entirely an oxide; the oxide can be, for example, approximately 200 Å thick for an operating voltage of 5 V and approximately 400 Å thick for an operating voltage of 12 V. The oxide thickness can range from 120 Å to 220 Å for 5V operating voltage. In one embodiment, dielectric 310 is an oxide/nitride/oxynitride (ONO) layer. In one embodiment for an operating voltage of 5V, a thermal oxide can be grown on the trench sidewalls to a thickness of approximately 65 Å, followed by deposition of a layer of nitride to a thickness of approximately 116 Å, and oxidation of the nitride layer to form a second oxide layer approximately 550 Å thick. In other embodiments, the thickness of the oxide is between 30 Å and 100 Å; the thickness of the nitride is between 80 Å and 400 Å; and the thickness of the oxynitride is between 10 Å and 30 Å.

Figure 3E:
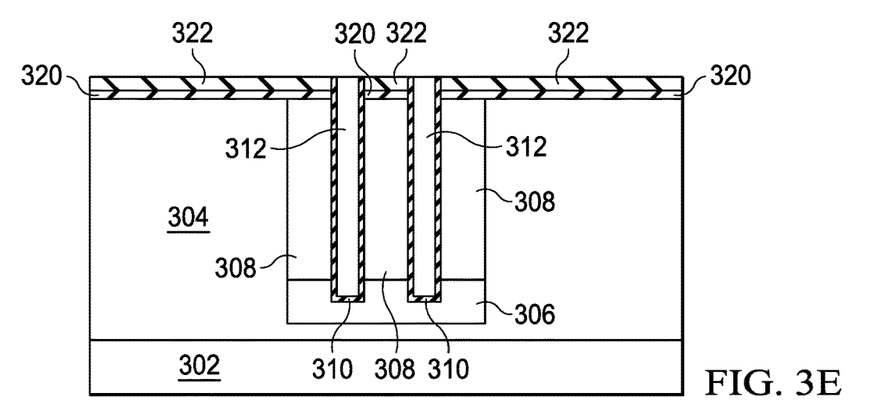

As shown in FIG. 3E, a highly doped polysilicon layer 312 is then deposited to fill the deep trenches. In at least one embodiment, in-situ doped P+ polysilicon is deposited to a thickness between 0.8 μm to 1.1 μm and having a doping level between $5\times10^{18}/cm^3$-$1\times10^{20}/cm^3$. The doped polysilicon is deposited to completely fill and overfill the trenches. The overfilled polysilicon is then removed by a planarization procedure such as CMP or etch back. In one embodiment, CMP is followed by a wet nitride strip. In at least one embodiment, this point is the end of the modular process that can be inserted into the flow to create a capacitor, although the capacitor is not yet completed. It will be understood that although further processing steps may provide further elements of the capacitor, these processing steps are part of the base flow to create structures needed elsewhere on the chip.

Figure 3F:
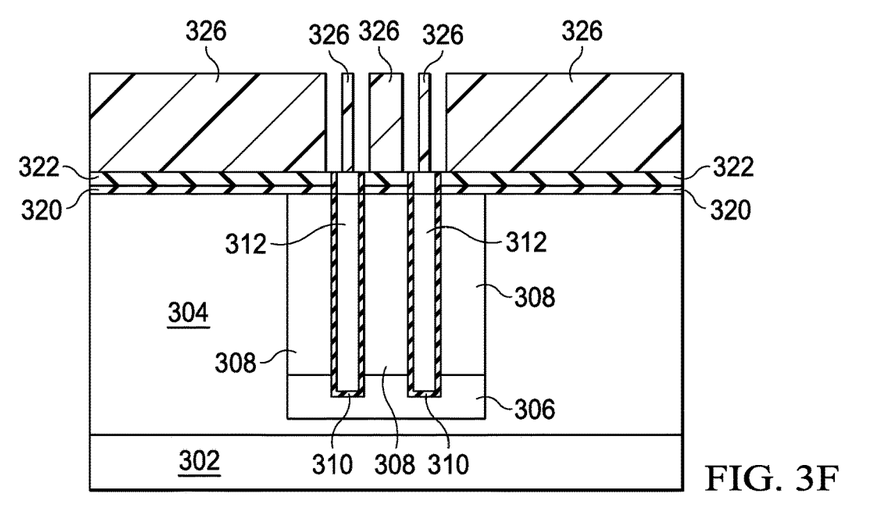
Figure 3G:
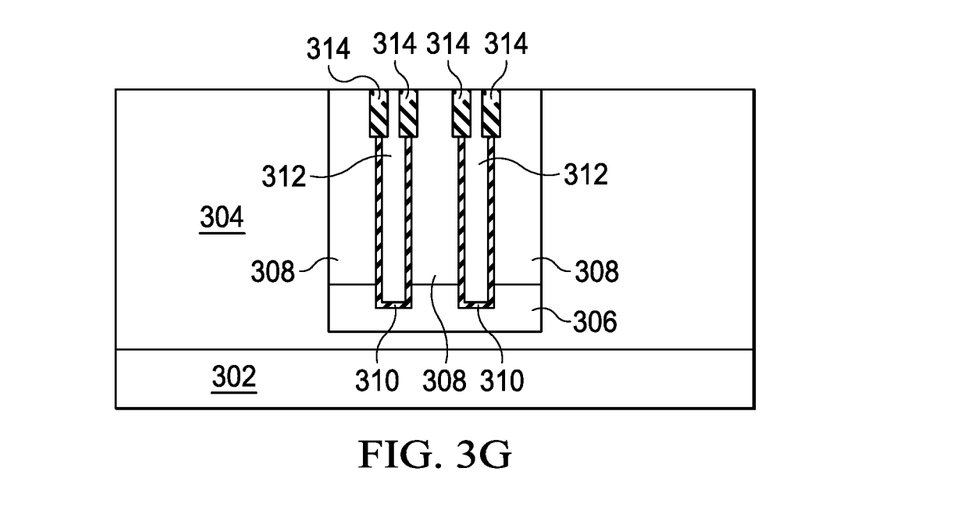

Referring now to FIG. 3F, another Photo-resist layer 326 is formed on the wafer surface and patterned to expose areas where the STI trenches are to be etched. STI Trenches are etched into the wafer surface (not specifically shown), after which photo-resist layer 326 is removed. A typical STI trench depth is approximately 250 to 375 nm. Looking at FIG. 3G, a liner oxide (not specifically shown) is grown or deposited on the exposed surfaces of the STI trench and the trench is overfilled with HDP oxide using chemical vapor deposition (CVD). Finally, the HDP oxide is planarized using CMP to complete the formation of STI Trenches 314.

Figure 3H:
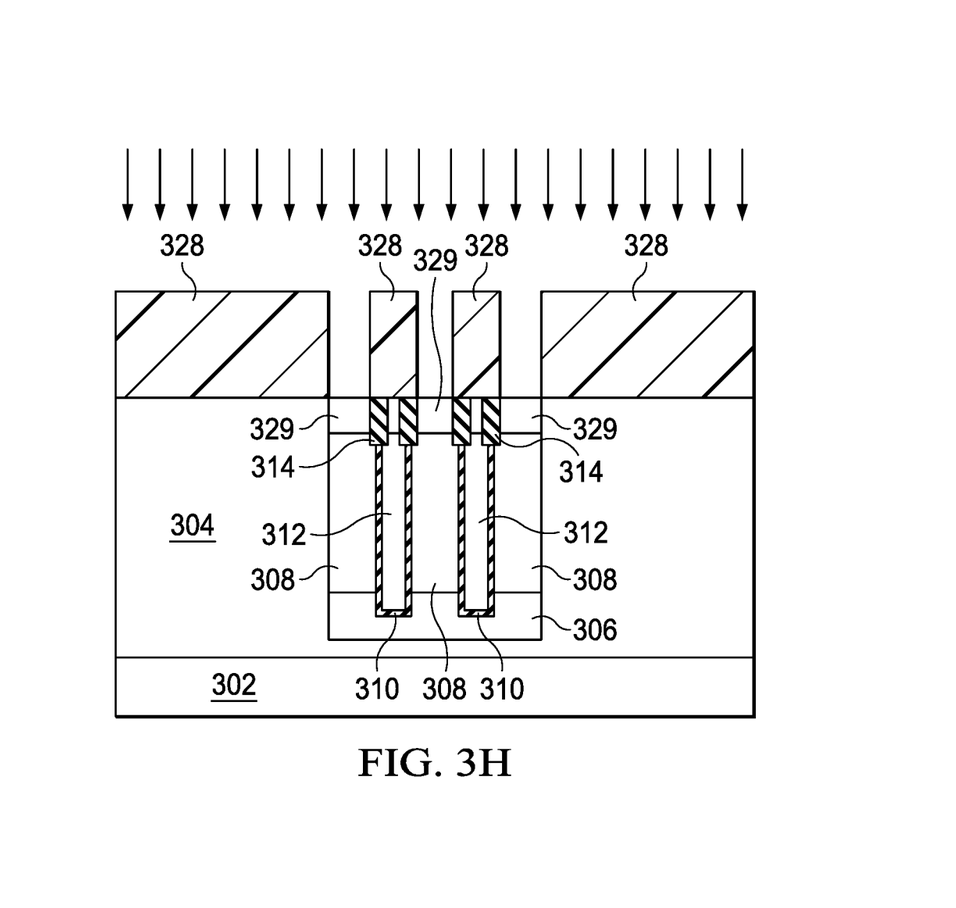
Figure 3I:
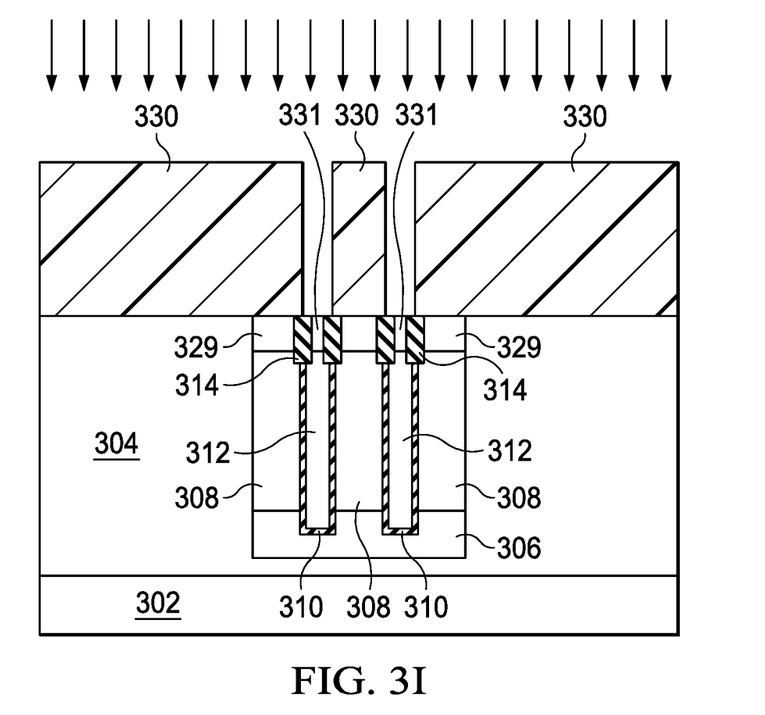
Figure 3J:
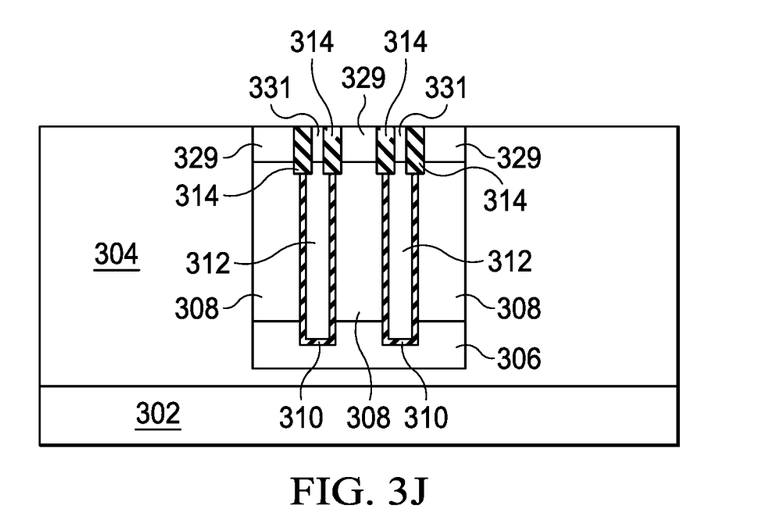

At a later point in the processing, source/drain regions are formed on the IC; the capacitor receives these implants to finalize the doping for the capacitor. As seen in FIG. 3H, photo-resist layer 328 is deposited on the wafer and patterned with an N-type source/drain pattern and the wafer is implanted with an N-type dopant such as phosphorus to form region 329. After the pattern is removed, photo-resist layer 330 is deposited on the wafer and patterned with a P-type source/drain pattern and the wafer is implanted with a P-type dopant such as boron to form region 331, as seen in FIG. 3I. Once the photo-resist layer is removed, the source/drain implants are annealed. Contact regions for both the bottom plate and top plate are also formed, but are not specifically shown in these figures. These steps complete formation of the capacitor, which is seen in FIG. 3J before any further processing is performed. It will be understood that other processing will continue on the IC according to the other components desired on the chip.

Figure 4A:
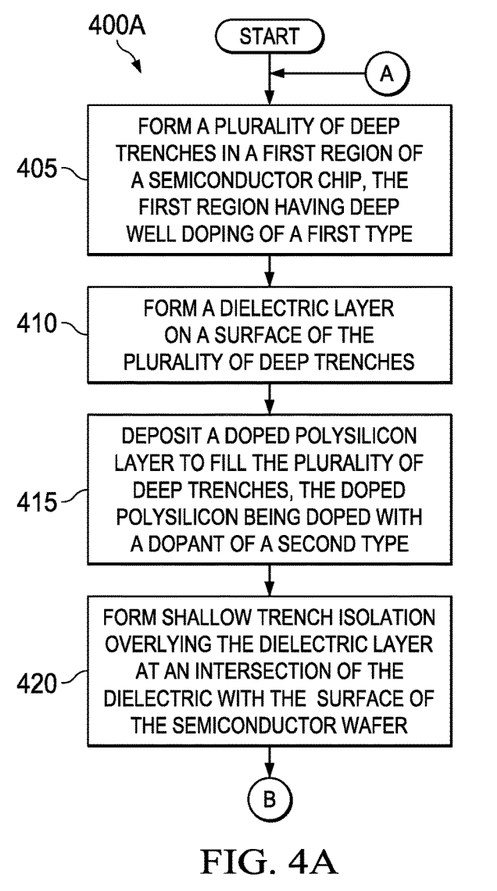
FIGS. 4A-E depict portions of a method of forming a deep trench capacitor in a semiconductor wafer according to an embodiment of the disclosure.
Figure 4B:
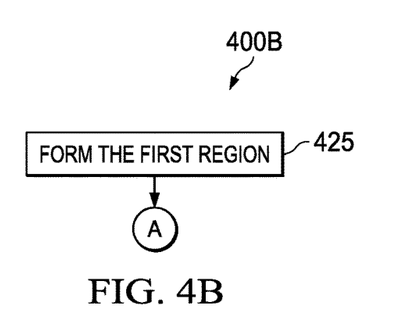

FIGS. 4A-E depict a simplified flowchart 400 of the formation of an integrated capacitor according to an embodiment of the disclosure. In FIG. 4A, method 400A starts with forming (405) a plurality of deep trenches in a first region of a semiconductor chip, the first region having well doping of a first type and continues with forming (410) a dielectric layer on a surface of the plurality of deep trenches. The method then deposits (415) a doped polysilicon layer to fill the plurality of deep trenches, the doped polysilicon being doped with a dopant of a second type, and forms (420) shallow trench isolation overlying the dielectric layer at an intersection of the dielectric with the surface of the semiconductor wafer. Prior to performing the elements of FIG. 4A, Method 400B includes forming (425) the first region, i.e., implanting a dopant and thermally driving the dopant deep into the silicon to form the well.

Figure 4C:
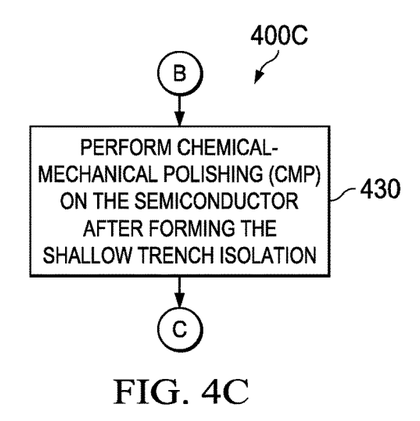
Figure 4D:
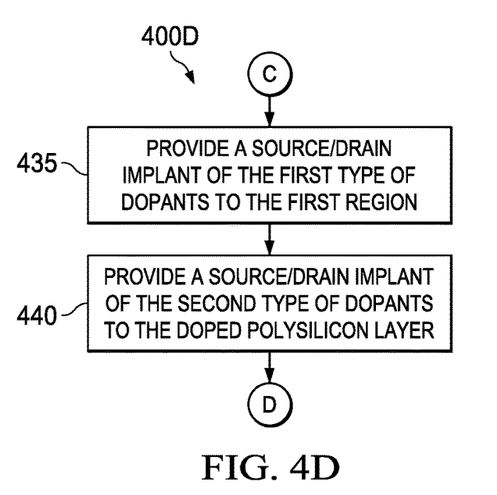
Figure 4E:
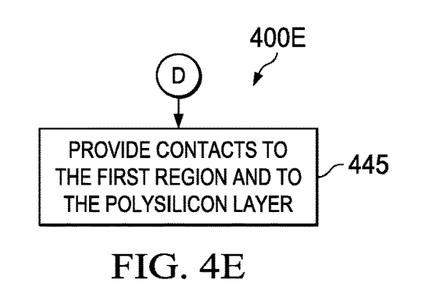

After forming the shallow trench isolation, method 400C performs (430) chemical-mechanical polishing (CMP) on the semiconductor. Method 400D provides (435) a source/drain implant of the first type of dopants to the first region and provides (440) a source/drain implant of the second type of dopants to the doped polysilicon layer. Method 400E further provides (445) contacts to the first region and to the polysilicon layer.

Applicants have disclosed a capacitor that can be integrated into existing semiconductor processor flows. The disclosed embodiments can be implemented in technologies that use a buried layer and well combination for isolation. The capacitor density may be as much as ten times higher than a TiN capacitor, e.g., 15 μF/μm$^2$ and adds only a single mask to the process. At least some disclosed embodiments can support 12V and even 20V applications.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An integrated circuit (IC), comprising:
   a plurality of deep trenches in a first region of a semiconductor substrate, the first region being doped with a dopant of a first type;
   a corresponding dielectric layer located on a sidewall surface of each deep trench;
   a corresponding doped polysilicon filler located within each dielectric layer;
   an oxide-filled trench located over each of the dielectric layers, the oxide-filled trench extending from the dielectric layer to a top surface of the semiconductor substrate;
   wherein the first region includes a heavily-doped region located between a buried layer and the top surface of the semiconductor substrate.

2. The IC as recited in claim 1 wherein the first type of dopant is N-type and the substrate is doped with a P-type dopant.

3. The IC as recited in claim 1 wherein bottoms of the plurality of deep trenches are located within a buried layer within the semiconductor substrate.

4. The IC as recited in claim 1 wherein the heavily doped region is located in an epitaxial layer over the buried layer.

5. The IC as recited in claim 4 wherein the epitaxial layer is P-type, the semiconductor substrate is P-type, and the first region is N-type.

6. The IC as recited in claim 1 wherein the dielectric layer comprises a thermal oxide.

7. The IC as recited in claim 6 wherein the dielectric layer further comprises a nitrogen-containing layer over the thermal oxide.

8. The IC as recited in claim 7 wherein the dielectric layer further comprises an oxynitride layer over a nitride layer.

9. The IC as recited in claim 1 further comprising a contact to the first region and a contact to the polysilicon filler.

10. The IC as recited in claim 1 wherein the first region and the polysilicon filler are both doped with N-type dopants.

11. The IC as recited in claim 1 wherein the oxide-filled trench is about 400 nm thick.

12. The IC as recited in claim 1 wherein the deep trenches have a depth between about 5 μm and about 9 μm.

13. The IC as recited in claim 1 further comprising a plurality of contacts corresponding to the plurality of deep trenches, wherein only a single contact of the plurality of contacts is connected to each of the deep trenches.

14. The IC as recited in claim 1 wherein each of the plurality of deep trenches has a circular or oval cross-section.

15. The IC as recited in claim 1 wherein the first region includes a buried layer and a heavily-doped region located between the buried layer and the top surface of the semiconductor substrate.

16. The IC as recited in claim 1 wherein the polysilicon filler is N-type.

17. The IC as recited in claim 1 wherein the corresponding doped polysilicon filler extends to the top surface of the semiconductor substrate.

18. An electronic device, comprising:
    a doped region having a first conductivity type located within a semiconductor substrate having a second opposite conductivity type, the doped region including a well region and a buried layer each having the first conductivity type;
    a deep trench including an insulating sidewall layer and a doped polysilicon filler that extends from a top surface of the semiconductor substrate toward the buried layer; and
    a shallow trench isolation (STI) structure that extends from the top surface of the semiconductor substrate to the insulating sidewall layer.

19. The device as recited in claim 18 wherein the dopant concentration in the well region is greater than the dopant concentration in the buried layer.

20. The device as recited in claim 18 wherein the substrate includes a P-type epitaxial layer in which the doped region is formed.

* * * * *